(12) United States Patent
Takahashi et al.

(10) Patent No.: US 11,726,150 B2
(45) Date of Patent: Aug. 15, 2023

(54) MAGNETIC SENSOR

(71) Applicant: TDK CORPORATION, Tokyo (JP)

(72) Inventors: Hirokazu Takahashi, Tokyo (JP); Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 11 days.

(21) Appl. No.: 17/575,197

(22) Filed: Jan. 13, 2022

(65) Prior Publication Data

US 2022/0236346 A1    Jul. 28, 2022

(30) Foreign Application Priority Data

Jan. 25, 2021    (JP) .................................. 2021-009817

(51) Int. Cl.
*G01R 33/09*    (2006.01)

(52) U.S. Cl.
CPC ......... *G01R 33/093* (2013.01); *G01R 33/096* (2013.01); *G01R 33/098* (2013.01)

(58) Field of Classification Search
CPC ... G01R 33/093; G01R 33/096; G01R 33/098
See application file for complete search history.

(56) References Cited

U.S. PATENT DOCUMENTS

| 5,783,284 A | 7/1998 | Shinjo et al. |
| 7,545,603 B2 * | 6/2009 | Kameda ................. G11B 5/265 360/122 |
| 2008/0169807 A1 | 7/2008 | Naito et al. |
| 2018/0257743 A1 * | 9/2018 | Tsuchizawa ........... B62J 45/415 |
| 2022/0229126 A1 | 7/2022 | Takahashi et al. |

FOREIGN PATENT DOCUMENTS

| DE | 102021006484 A1 | 7/2022 |
| EP | 1860450 A1 | 11/2007 |
| JP | 2000-215413 A | 8/2000 |
| JP | 2005-227134 A | 8/2005 |

OTHER PUBLICATIONS

English Translation of the Technical Parts of the Sep. 8, 2022 German Office Action issued in German Patent Application No. 102022101684.6.

* cited by examiner

*Primary Examiner* — Alesa Allgood
(74) *Attorney, Agent, or Firm* — Oliff PLC

(57) ABSTRACT

A magnetic sensor includes an MR element and a support member. The support member has an opposed surface including a first inclined portion, and a bottom surface. In a given cross section, the first inclined portion is inclined at a first angle at a first position, and inclined at a second angle smaller than the first angle at a second position. The absolute value of a curvature of the first inclined portion at the first position is less than the absolute value of the curvature of the first inclined portion at the second position. The MR element is provided on the first inclined portion so that the first edge is located above the first position in a given cross section.

9 Claims, 16 Drawing Sheets

MAGNETIC SENSOR

CROSS REFERENCE TO RELATED APPLICATIONS

This application claims the benefit of Japanese Priority Patent Application No. 2021-009817 filed on Jan. 25, 2021, the entire contents of which are incorporated herein by reference.

BACKGROUND

The technology relates to a magnetic sensor including a magnetoresistive element.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

US 2008/0169807 A1 discloses first and second magnetic sensors each including an X-axis sensor, a Y-axis sensor, and a Z-axis sensor disposed on a substrate. The first magnetic sensor has V-shaped grooves in a thick film located on its substrate. Band-like portions of giant magnetoresistive elements constituting the Z-axis sensor are disposed at locations having favorable flatness in the centers of the inclined surfaces of the grooves. The band-like portions are portions constituting the main bodies of the giant magnetoresistive elements and have a long slender band-like planar shape.

The second magnetic sensor has V-shaped grooves each having a first inclined surface and a second inclined surface in thick films located on its substrate. The second inclined surface constitutes a lower half of the inclined surface of the groove. An angle that the second inclined surface forms with the substrate is greater than an angle that the first inclined surface forms with the substrate. Band-like portions of giant magnetoresistive elements constituting the Z-axis sensor are disposed at locations having favorable flatness in the centers of the second inclined surfaces. The band-like portions have a long slender band-like planar shape.

US 2008/0169807 A1 describes the fact that the inclined surface is actually formed as a curved surface somewhat bulging out because of the manufacturing process.

A magnetoresistive element is typically formed by etching a layered film to be the magnetoresistive element by ion milling or reactive ion etching. This etching process uses a photoresist mask. The photoresist mask is formed at a desired position on the layered film by using photolithography. The photoresist mask has a planar shape corresponding to that of the magnetoresistive element. However, the position and dimensions of the photoresist mask can vary due to the precision of the photolithography.

The effect of variations in the position and dimensions of the photoresist mask appear evidently in forming the magnetoresistive element on a curved surface. To form the magnetoresistive element on a curved surface, the layered film is typically formed in the shape of the curved surface by using a so-called non-conformal film formation apparatus such as a magnetron sputtering apparatus. The thickness (dimension in a direction perpendicular to the curved surface) of the layered film thus decreases as the inclination angle of the curved surface increases.

Suppose that the curved surface is shaped to bulge out. The amount of change in the inclination angle when the position on the curved surface changes horizontally by a predetermined distance increases with increasing distance from the top of the curved surface. Similarly, the amount of change in the thickness of the layered film increases with increasing distance from the top of the curved surface. If the position or dimensions of the photoresist mask vary to change the position of a wall surface of the photoresist mask on a side opposite from the top of the curved surface, the thickness of the magnetoresistive element changes greatly near the edge of the magnetoresistive element located on the side opposite from the top of the curved surface. This gives rise to a problem that the desired characteristic is not obtained.

The foregoing problem also arises if the magnetoresistive element is formed on a curved surface of a recessed shape.

SUMMARY

A magnetic sensor according to one embodiment of the technology includes a magnetoresistive element whose resistance changes with an external magnetic field, and a support member configured to support the magnetoresistive element. The support member has an opposed surface opposed to the magnetoresistive element, and a bottom surface formed of a flat surface located opposite the opposed surface. The opposed surface includes an inclined portion inclined relative to the bottom surface. In a specific cross section of the magnetic sensor perpendicular to the bottom surface, the inclined portion is inclined relative to the bottom surface at a first angle at a first position on the inclined portion, and inclined relative to the bottom surface at a second angle at a second position on the inclined portion, the second angle being smaller than the first angle.

An absolute value of a curvature of the inclined portion at the first position is less than an absolute value of a curvature of the inclined portion at the second position. The magnetoresistive element has a first edge and a second edge located at both ends of the magnetoresistive element in a width direction, and is provided on the inclined portion so that the first edge is located above the first position in the cross section.

In the magnetic sensor according to one embodiment of the technology, the magnetoresistive element may be provided on the inclined portion so that the second edge is located above the second position in the cross section.

In the magnetic sensor according to one embodiment of the technology, the first position and the second position may fall within a range from a third position on the inclined portion closest to the bottom surface in the cross section to a fourth position on the inclined portion farthest from the bottom surface in the cross section. In such a case, the inclined portion may be inclined relative to the bottom surface so that the first angle is a maximum and the second angle is a minimum within a range from the first position to the second position. The absolute value of the curvature of the inclined portion may be minimized at the first position and maximized at a predetermined position other than the first position within the range from the first position to the second position.

In the magnetic sensor according to one embodiment of the technology, the opposed surface may include a convex surface protruding in a direction away from the bottom surface. In such a case, the inclined portion may be a part of the convex surface. Alternatively, the opposed surface may include a concave surface recessed toward the bottom surface. In such a case, the inclined portion may be a part of the concave surface.

In the magnetic sensor according to one embodiment of the technology, the magnetoresistive element may include a magnetic layer having a magnetization whose direction is variable depending on the external magnetic field. The magnetic layer may have a first surface and a second surface located opposite the first surface, and have a thickness that is a dimension in a direction perpendicular to the first surface of the magnetic layer. The thickness at the first edge may be smaller than the thickness at the second edge. The thickness may decrease toward the first edge from the second edge. The first surface and the second surface may each have a shape long in a direction intersecting the cross section.

In the magnetic sensor according to one embodiment of the technology, the inclined portion of the opposed surface of the support member is inclined relative to the bottom surface at the first angle at the first position, and inclined relative to the bottom surface at the second angle smaller than the first angle at the second position. The absolute value of the curvature of the inclined portion at the first position is less than that of the curvature of the inclined portion at the second position. The magnetoresistive element is provided on the inclined portion so that the first edge is located above the first position. According to one embodiment of the technology, a change in the thickness of the magnetoresistive element due to variations in the manufacturing process can thereby be reduced.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
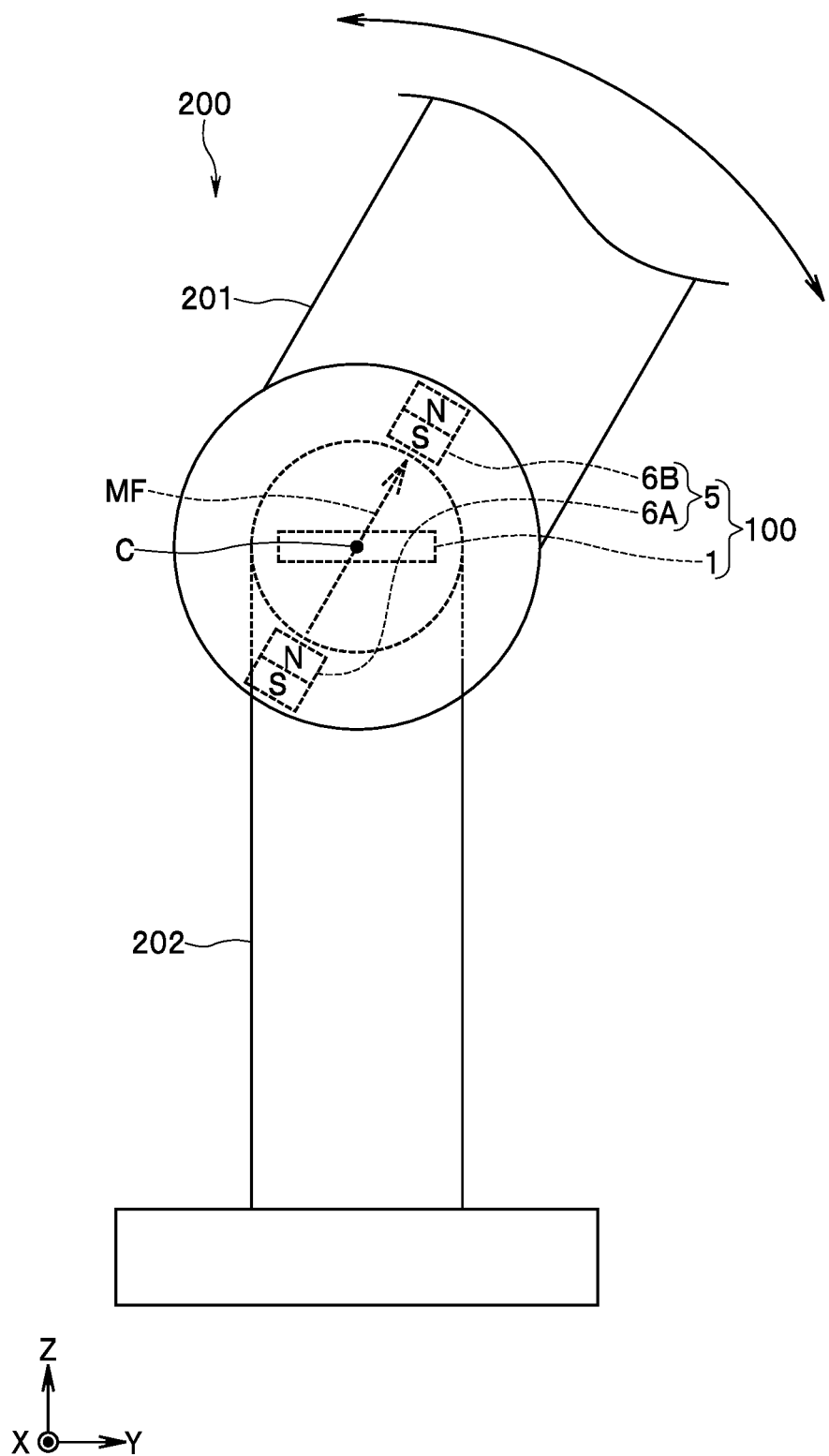
FIG. 1 is an explanatory diagram showing a schematic configuration of a magnetic sensor system of a first example embodiment of the technology.

An object of the technology is to provide a magnetic sensor configured so that a change in the thickness of a magnetoresistive element located on an inclined portion due to variations in the manufacturing process can be reduced.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Example embodiments of the technology will now be described in detail with reference to the drawings. An outline of a magnetic sensor system including a magnetic sensor according to a first example embodiment of the technology will initially be described with reference to FIG. 1. A magnetic sensor system 100 according to the present example embodiment includes a magnetic sensor 1 according to the present example embodiment and a magnetic field generator 5. The magnetic field generator 5 generates a target magnetic field MF that is a magnetic field for the magnetic sensor 1 to detect (magnetic field to be detected).

The magnetic field generator 5 is rotatable about a rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor 1 is located at a position where the target magnetic field MF at a predetermined reference position can be detected. The target magnetic field MF at the reference position is part of the magnetic fields generated by the respective magnets 6A and 6B. The reference position may be located on the rotation axis C. In the following description, the reference position is located on the rotation axis C. The magnetic sensor 1 detects the target magnetic field MF generated by the magnetic field generator 5, and generates a detection value Vs. The detection value Vs has a correspondence with a relative position, or rotational position in particular, of the magnetic field generator 5 with respect to the magnetic sensor 1.

The magnetic sensor system 100 can be used as a device for detecting the rotational position of a rotatable moving part in an apparatus that includes the moving part. Examples of such an apparatus include a joint of an industrial robot. FIG. 1 shows an example where the magnetic sensor system 100 is applied to an industrial robot 200.

The industrial robot 200 shown in FIG. 1 includes a moving part 201 and a support unit 202 that rotatably supports the moving part 201. The moving part 201 and the support unit 202 are connected at a joint. The moving part 201 rotates about the rotation axis C. For example, if the magnetic sensor system 100 is applied to the joint of the industrial robot 200, the magnetic sensor 1 may be fixed to the support unit 202, and the magnets 6A and 6B may be fixed to the moving part 201.

Now, we define X, Y, and Z directions as shown in FIG. 1. The X, Y, and Z directions are orthogonal to one another. In the present example embodiment, a direction parallel to the rotation axis C (in FIG. 1, a direction out of the plane of the drawing) will be referred to as the X direction. In FIG. 1, the Y direction is shown as a rightward direction, and the Z direction is shown as an upward direction. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above".

In the present example embodiment, the direction of the target magnetic field MF at the reference position is expressed as a direction within the YZ plane including the reference position on the rotation axis C. The direction of the target magnetic field MF at the reference position rotates about the reference position within the foregoing YZ plane.

The magnetic sensor 1 includes magnetoresistive elements (hereinafter, referred to as MR elements) whose resistances change with an external magnetic field. In the present example embodiment, the resistances of the MR elements change with a change in the direction of the target magnetic field MF. The magnetic sensor 1 generates detection signals corresponding to the resistances of the MR elements, and generates a detection value Vs based on the detection signals.

Next, a configuration of the magnetic sensor 1 according to the present example embodiment will be described. An example of a circuit configuration of the magnetic sensor 1 will initially be described with reference to FIG. 2. In the example shown in FIG. 2, the magnetic sensor 1 includes four resistor sections 11, 12, 13, and 14, two power supply nodes V1 and V2, two ground nodes G1 and G2, and two signal output nodes E1 and E2.

The resistor sections 11 to 14 each include at least one MR element 30. If each of the resistor sections 11 to 14 includes a plurality of MR elements 30, the plurality of MR elements 30 in each of the resistor sections 11 to 14 may be connected in series.

The resistor section 11 is provided between the power supply node V1 and the signal output node E1. The resistor section 12 is provided between the signal output node E1 and the ground node G1. The resistor section 13 is provided between the power supply node V2 and the signal output node E2. The resistor section 14 is provided between the signal output node E2 and the ground node G2. The power supply nodes V1 and V2 are configured to receive a power supply voltage of predetermined magnitude. The ground nodes G1 and G2 are connected to the ground.

The potential of the connection point between the resistor section 11 and the resistor section 12 changes depending on the resistance of the at least one MR element 30 of the resistor section 11 and the resistance of the at least one MR element 30 of the resistor section 12. The signal output node E1 outputs a signal corresponding to the potential of the connection point between the resistor section 11 and the resistor section 12 as a detection signal S1.

The potential of the connection point between the resistor section 13 and the resistor section 14 changes depending on the resistance of the at least one MR element 30 of the resistor section 13 and the resistance of the at least one MR element 30 of the resistor section 14. The signal output node E2 outputs a signal corresponding to the potential of the connection point between the resistor section 13 and the resistor section 14 as a detection signal S2.

The magnetic sensor 1 further includes a detection value generation circuit 21 that generates the detection value Vs on the basis of the detection signals S1 and S2. The detection value generation circuit 21 includes an application specific integrated circuit (ASIC) or a microcomputer, for example.

Figure 3:
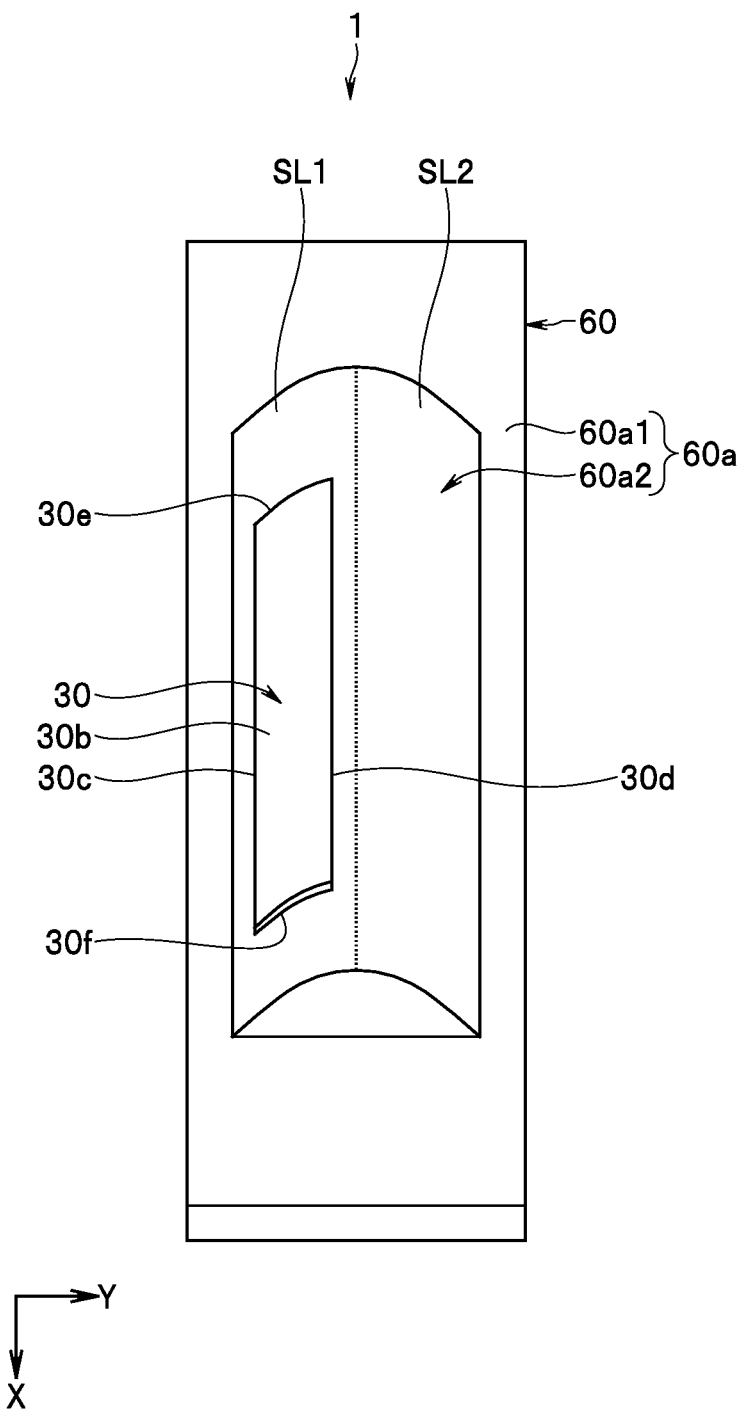
FIG. 3 is a schematic diagram showing a part of the magnetic sensor according to the first example embodiment of the technology.
Figure 4:
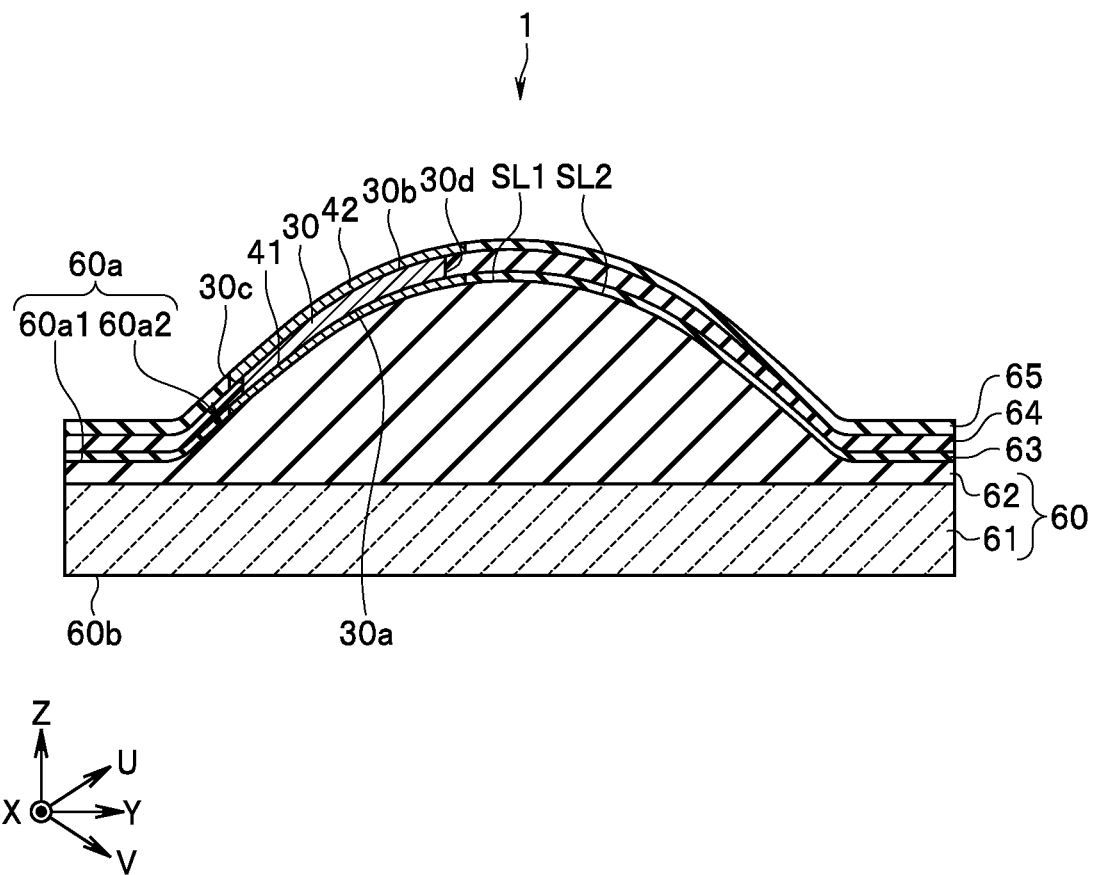
FIG. 4 is a cross-sectional view showing a part of the magnetic sensor according to the first example embodiment of the technology.
Figure 5:
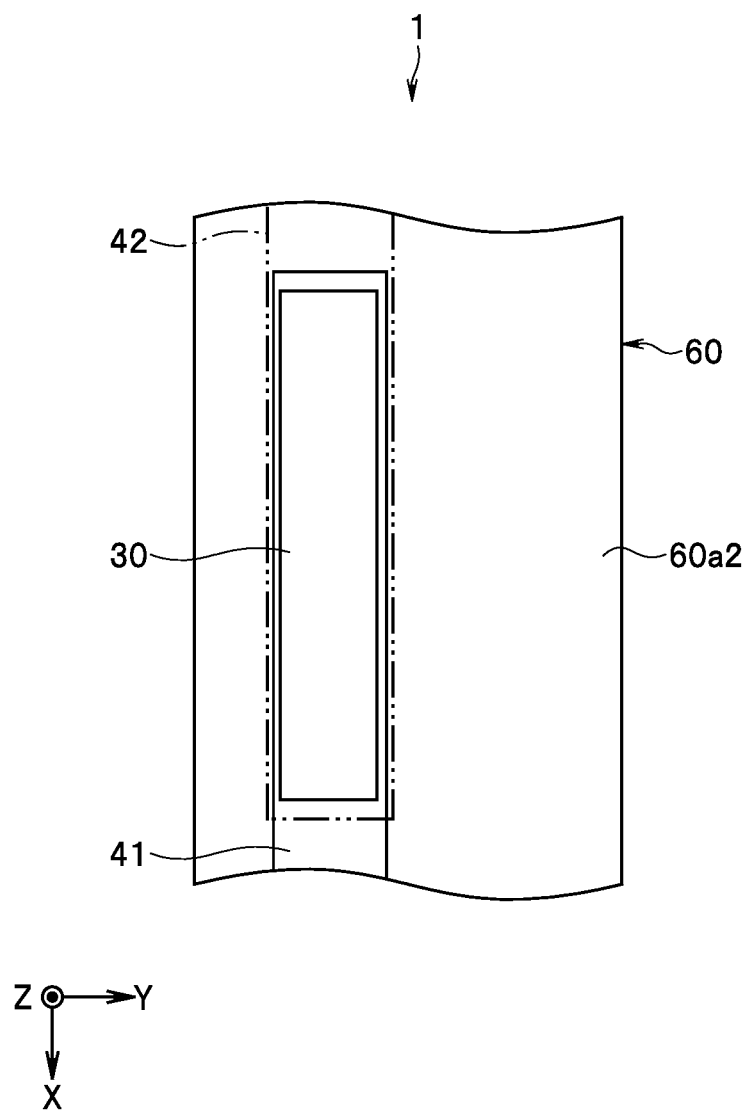
FIG. 5 is a plan view showing a part of the magnetic sensor according to the first example embodiment of the technology.

Next, the configuration of the magnetic sensor 1 will be described in more detail with attention focused on one MR element 30. FIG. 3 is a schematic diagram showing a part of the magnetic sensor 1. FIG. 4 is a cross-sectional view showing a part of the magnetic sensor 1. FIG. 4 shows a cross section parallel to the YZ plane and intersecting the MR element 30. FIG. 5 is a plan view showing a part of the magnetic sensor 1.

The magnetic sensor 1 further includes a support member 60. The support member 60 supports all the MR elements 30 included in the resistor sections 11 to 14. As shown in FIGS. 3 and 4, the support member 60 includes an opposed surface 60a opposed, at least in part, to the MR elements 30, and a bottom surface 60b formed of a flat surface located opposite the opposed surface 60a. The opposed surface 60a is located at an end of the support member 60 in the Z direction. The bottom surface 60b is located at an end of the support member 60 in the −Z direction. The bottom surface 60b is parallel to the XY plane. For example, the magnetic sensor 1 may be manufactured with the bottom surface 60b or a surface corresponding to the bottom surface 60b made horizontal. For example, the magnetic sensor 1 may be installed based on the direction or tilt of the bottom surface 60b or the surface corresponding to the bottom surface 60b.

The bottom surface 60b may thus serve as a reference plane in at least either the manufacturing or the installing of the magnetic sensor 1.

The opposed surface 60a of the support member 60 includes an inclined portion inclined relative to the bottom surface 60b. In the present example embodiment, the opposed surface 60a includes a flat portion 60a1 parallel to the bottom surface 60b and at least one curved portion 60a2 not parallel to the bottom surface 60b. As shown in FIG. 4, the curved portion 60a2 is a convex surface protruding in a direction away from the bottom surface 60b. The foregoing inclined portion is a part of the convex surface. The curved portion 60a2 has a curved shape (arch shape) curved to protrude in a direction away from the bottom surface 60b (Z direction) in a given cross section parallel to the YZ plane. In a given cross section parallel to the YZ plane, the distance from the bottom surface 60b to the curved portion 60a2 is maximized at the center of the curved portion 60a2 in a direction parallel to the Y direction (hereinafter, referred to simply as the center of the curved portion 60a2).

The curved portion 60a2 extends along the X direction. As shown in FIG. 3, the overall shape of the curved portion 60a2 is a semicylindrical curved surface formed by moving the curved shape (arch shape) shown in FIG. 4 along the X direction.

The MR element 30 is located on the curved portion 60a2. A portion of the curved portion 60a2 from an edge at the end of the curved portion 60a2 in the −Y direction to the center of the curved portion 60a2 will be referred to as a first inclined portion and be denoted by the symbol SL1. A portion of the curved portion 60a2 from an edge at the end of the curved portion 60a2 in the Y direction to the center of the curved portion 60a2 will be referred to as a second inclined portion and be denoted by the symbol SL2. In FIG. 3, the border between the first inclined portion SL1 and the second inclined portion SL2 is shown by a dotted line. Both the first and second inclined portions SL1 and SL2 are inclined relative to the bottom surface 60b. In the present example embodiment, the entire MR element 30 is located on the first inclined portion SL1 or the second inclined portion SL2. FIGS. 3 and 4 show the MR element 30 located on the first inclined portion SL1.

The MR element 30 has a shape that is long in the X direction. As employed herein, the lateral direction of the MR element 30 will be referred to as the width direction of the MR element 30 or simply as the width direction. The MR element 30 may have a planar shape (shape seen in the Z direction), like a rectangle, including a constant width portion having a constant or substantially constant width in the width direction regardless of the position in the X direction. The MR element 30 may have a planar shape including no constant width portion, like an ellipse. Examples of the planar shape of the MR element 30 including a constant width portion include a rectangular shape where both longitudinal ends are straight, an oval shape where both longitudinal ends are semicircular, and a shape where both longitudinal ends are polygonal. FIGS. 3 and 5 show the case where the MR element 30 has a rectangular planar shape. In this example, the MR element 30 has a bottom surface 30a, a top surface 30b, a first edge 30c, a second edge 30d, a third edge 30e, and a fourth edge 30f. The bottom surface 30a is opposed to the curved portion 60a2. The top surface 30b is located opposite the bottom surface 30a. The first and second edges 30c and 30d are located at both ends in the width direction. The third and fourth edges 30e and 30f are located at both ends in the longitudinal direction. The dimension of the MR element 30 in the width direction is constant or substantially constant regardless of the position in the X direction.

The support member 60 includes a substrate 61 and an insulating layer 62 located on the substrate 61. The substrate 61 is a semiconductor substrate made of a semiconductor such as Si, for example. The substrate 61 has a top surface located at an end of the substrate 61 in the Z direction, and a bottom surface located at an end of the substrate 61 in the −Z direction. The bottom surface 60b of the support member 60 is constituted by the bottom surface of the substrate 61. The substrate 61 has a constant thickness (dimension in the Z direction).

The insulating layer 62 is made of an insulating material such as SiO₂, for example. The insulating layer 62 includes a top surface located at an end in the Z direction. The opposed surface 60a of the support member 60 is constituted by the top surface of the insulating layer 62. The insulating layer 62 has a cross-sectional shape such that the curved portion 60a2 is formed on the opposed surface 60a. Specifically, the insulating layer 62 has a cross-sectional shape of bulging out in the Z direction in a given cross section parallel to the YZ plane.

The magnetic sensor 1 further includes a lower electrode 41, an upper electrode 42, and insulating layers 63, 64 and 65. In FIG. 3, the lower electrode 41, the upper electrode 42, and the insulating layers 63 to 65 are omitted. In FIG. 5, the insulating layers 63 to 65 are omitted.

The lower electrode 41 is located on the opposed surface 60a of the support member 60 (the top surface of the insulating layer 62). The insulating layer 63 is located on the opposed surface 60a of the support member 60, around the lower electrode 41. The MR element 30 is located on the lower electrode 41. The insulating layer 64 is located on the lower electrode 41 and the insulating layer 63, around the MR element 30. The upper electrode 42 is located on the MR element 30 and the insulating layer 64. The insulating layer 65 is located on the insulating layer 64, around the upper electrode 42.

The magnetic sensor 1 further includes a not-shown insulating layer covering the upper electrode 42 and the insulating layer 65. The lower electrode 41 and the upper electrode 42 are made of a conductive material such as Cu, for example. The insulating layers 63 to 65 and the not-shown insulating layer are made of an insulating material such as SiO₂, for example.

The substrate 61 and the portions of the magnetic sensor 1 stacked on the substrate 61 are referred to collectively as a detection unit. FIG. 4 can be said to show the detection unit. The detection value generation circuit 21 shown in FIG. 2 may be integrated with or separate from the detection unit.

Figure 6:
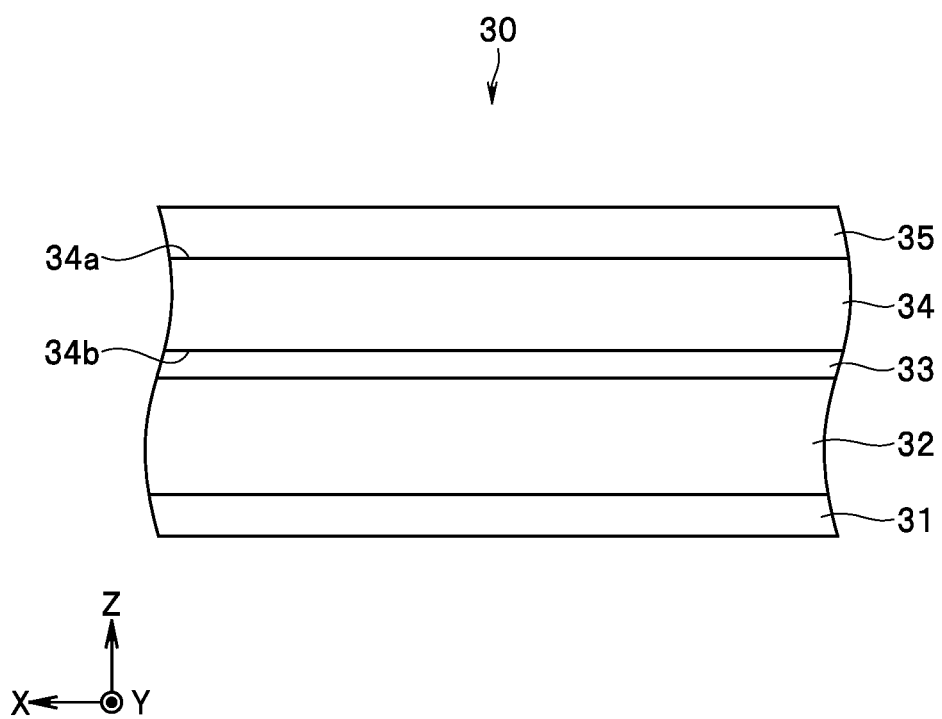
FIG. 6 is a cross-sectional view showing a magnetoresistive element of the first example embodiment of the technology.

Now, the configuration of the MR element 30 will be described in detail with reference to FIG. 6. In particular, in the present example embodiment, the MR element 30 is a spin-valve MR element. As shown in FIG. 6, the MR element 30 includes a magnetization pinned layer 32 having a magnetization whose direction is fixed, a free layer 34 having a magnetization whose direction is variable depending on the direction of an external magnetic field, and a spacer layer 33 located between the magnetization pinned layer 32 and the free layer 34. The MR element 30 may be a tunneling magnetoresistive (TMR) element or a giant magnetoresistive (GMR) element. In the TMR element, the spacer layer 33 is a tunnel barrier layer. In the GMR element, the spacer layer 33 is a nonmagnetic conductive layer. The resistance of the MR element 30 changes with an angle that the direction of the magnetization of the free layer 34 forms with respect to the direction of the magnetization of the magnetization pinned layer 32. The resistance is minimized if the angle is 0°. The resistance is maximized if the angle is 180°.

The magnetization pinned layer 32, the spacer layer 33, and the free layer 34 are stacked in this order from the lower electrode 41 in the direction toward the upper electrode 42. The MR element 30 further includes an underlayer 31 interposed between the magnetization pinned layer 32 and the lower electrode 41, and a cap layer 35 interposed between the free layer 34 and the upper electrode 42. The arrangement of the magnetization pinned layer 32, the spacer layer 33, and the free layer 34 in the MR element 30 may be vertically reversed from that shown in FIG. 6.

The direction of the magnetization of the magnetization pinned layer 32 is desirably orthogonal to the longitudinal direction of the MR element 30. In the present example embodiment, the MR element 30 is located on the first inclined portion SL1 or the second inclined portion SL2 inclined relative to the bottom surface 60b. The direction of the magnetization of the magnetization pinned layer 32 is thus also inclined relative to the bottom surface 60b.

For the sake of convenience, in the present example embodiment, the direction of the magnetization of the magnetization pinned layer 32 located on the first inclined portion SL1 will be referred to as a U direction or a −U direction. The U direction is a direction rotated from the Y direction toward the Z direction by a predetermined angle. The −U direction is the direction opposite to the U direction. For the sake of convenience, in the present example embodiment, the direction of the magnetization of the magnetization pinned layer 32 located on the second inclined portion SL2 will be referred to as a V direction or a −V direction. The V direction is a direction rotated from the Y direction toward the −Z direction by a predetermined angle. The −V direction is the direction opposite to the V direction.

Figure 2:
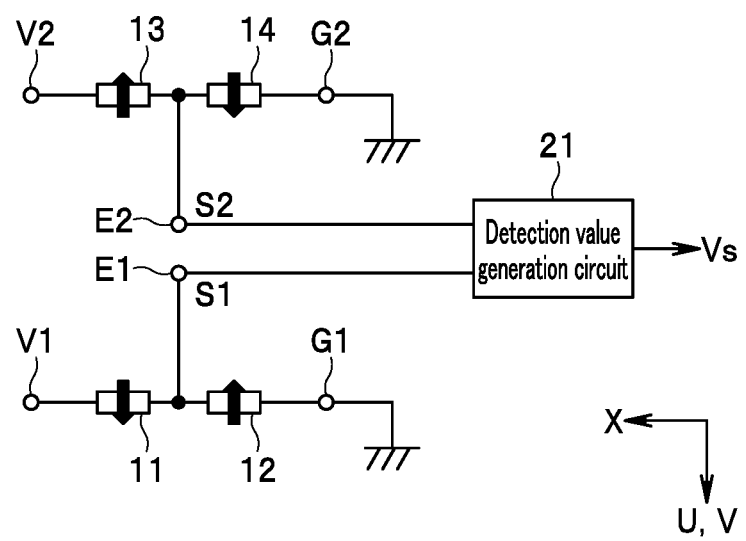
FIG. 2 is a circuit diagram showing the circuit configuration of a magnetic sensor according to the first example embodiment of the technology.

The X, U, and V directions are shown in FIG. 2. For the sake of convenience, in FIG. 2, the U direction and the V direction are indicated by the same arrow. In FIG. 2, the filled arrows indicate the directions of the magnetizations of the magnetization pinned layers 32 of the MR elements 30 included in the respective resistor sections 11 to 14. The magnetic sensor 1 may be configured so that the directions of the magnetizations of the magnetization pinned layers 32 of the MR elements 30 in the resistor sections 11 and 14 are the U direction, and the directions of the magnetizations of the magnetization pinned layers 32 of the MR elements 30 in the resistor sections 12 and 13 are the −U direction. Alternatively, the magnetic sensor 1 may be configured so that the directions of the magnetizations of the magnetization pinned layers 32 of the MR elements 30 in the resistor sections 11 and 14 are the V direction, and the directions of the magnetizations of the magnetization pinned layers 32 of the MR elements 30 in the resistor sections 12 and 13 are the −V direction.

Alternatively, the magnetic sensor 1 may include a first circuit portion and a second circuit portion each including the resistor sections 11 to 14. The first circuit portion may be configured so that the directions of the magnetizations of the magnetization pinned layers 32 of the MR elements 30 in the resistor sections 11 and 14 are the U direction, and the directions of the magnetizations of the magnetization pinned layers 32 of the MR elements 30 in the resistor sections 12 and 13 are the −U direction. The second circuit portion may be configured so that the directions of the magnetizations of the magnetization pinned layers 32 of the MR elements 30 in the resistor sections 11 and 14 are the V direction, and the directions of the magnetizations of the magnetization pinned layers 32 of the MR elements 30 in the resistor sections 12 and 13 are the −V direction.

The free layer 34 corresponds to a magnetic layer according to the technology. The free layer 34 has magnetic shape anisotropy where the direction of the easy axis of magnetization intersects the direction of the magnetization of the magnetization pinned layer 32. In the present example embodiment, the MR element 30 is patterned to a shape that is long in the X direction. This gives the free layer 34 magnetic shape anisotropy where the direction of the easy axis of magnetization is parallel to the X direction.

Up to this point, the configuration of the magnetic sensor 1 has been described with attention focused on one MR element 30. In the present example embodiment, the resistor sections 11 to 14 each include at least one MR element 30. The magnetic sensor 1 thus includes a plurality of MR elements 30, a plurality of lower electrodes 41, and a plurality of upper electrodes 42. As shown in FIG. 5, each of the lower electrodes 41 has a long slender shape. The MR element 30 is provided on the top surface of the lower electrode 41, near one end in the longitudinal direction. Each upper electrode 42 has a long slender shape and is located over two lower electrodes 41 to electrically connect two adjoining MR elements 30.

The number of the curved portions 60a2 of the opposed surface 60a of the support member 60 may be one or more than one. If the number of the curved portions 60a2 is one, the plurality of MR elements 30 are located on the one curved portion 60a2. In such a case, the plurality of MR elements 30 may be located on either one of the first and second inclined portions SL1 and SL2 or on both the first and second inclined portions SL1 and SL2.

If the number of curved portions 60a2 is more than one, one or a plurality of MR elements 30 may be located on one curved portion 60a2. In such a case, the plurality of curved portions 60a2 may be arranged along one direction. Alternatively, the plurality of curved portions 60a2 may be arranged in a plurality of rows, i.e., more than one curved portion 60a2 in both the X and Y directions.

Figure 7:
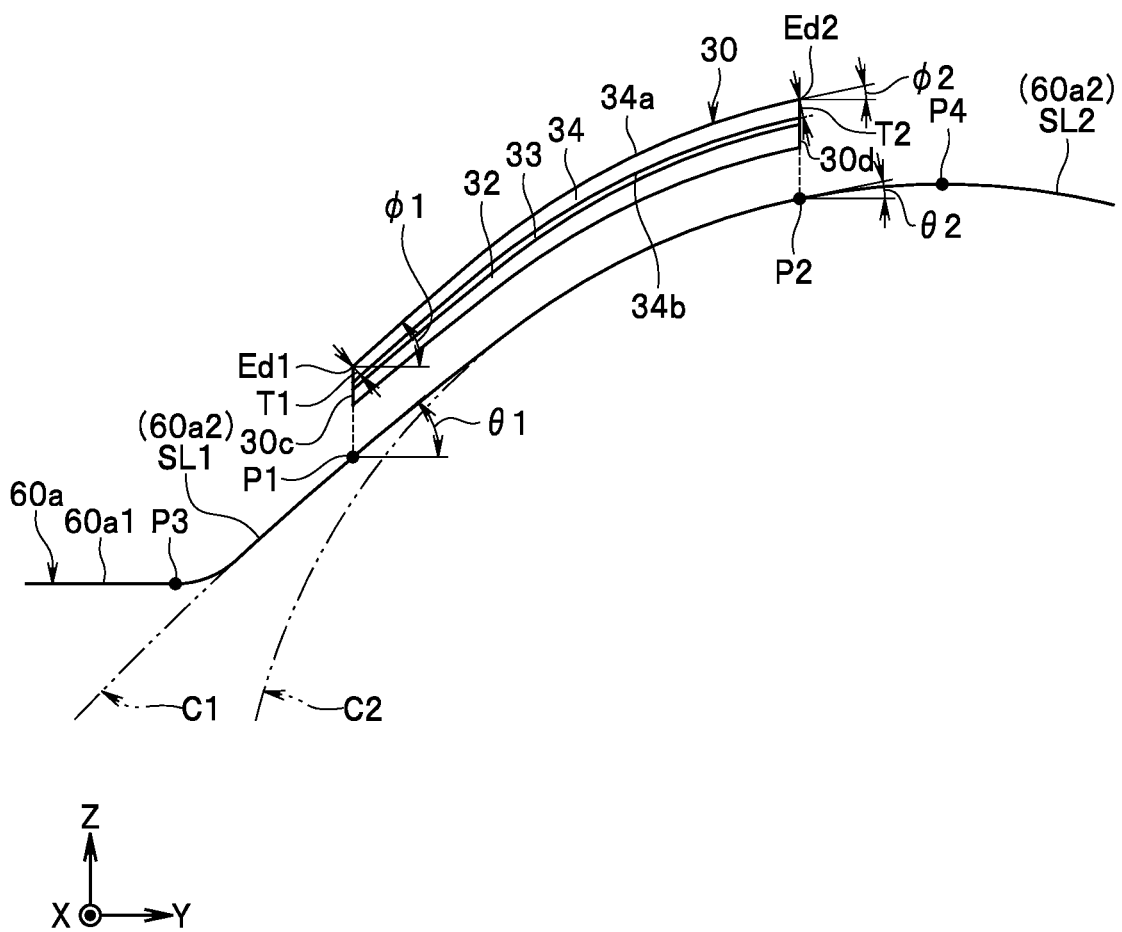
FIG. 7 is an explanatory diagram for describing a shape of an inclined portion of the first example embodiment of the technology.

Next, the inclined portions and the MR elements 30 will be described in more detail with reference to FIGS. 6 and 7. The following description will be given by using the first inclined portion SL1 as an example. FIG. 7 is an explanatory diagram for describing the shape of the first inclined portion SL1. In FIG. 7, the underlayer 31 and the cap layer 35 of the MR element 30 are omitted.

FIG. 7 shows a specific cross section intersecting the MR element 30 and being perpendicular to the bottom surface 60b of the support member 60. Such a cross section will hereinafter be denoted by the symbol S. The cross section S intersects the longitudinal direction of the MR element 30. To describe the shape of the first inclined portion SL1, a first position P1, a second position P2, a third position P3, and a fourth position P4 on the first inclined portion SL1 in a given cross section S will be defined as follows. The first position P1 is a position where the first inclined portion SL1 is inclined relative to the bottom surface 60b at a first angle θ1. The second position P2 is a position where the first inclined portion SL1 is inclined relative to the bottom surface 60b at a second angle θ2 smaller than the first angle θ1. In the present example embodiment, in particular, the first position P1 is closer to the bottom surface 60b than is the second position P2. In the following description, the angle that a specific surface forms with the bottom surface 60b will be expressed in terms of an angle of 0° or more and not more than 90°.

The third position P3 is the position on the first inclined portion SL1 closest to the bottom surface 60b. Specifically, the third position P3 refers to the end of the first inclined portion SL1 in the −Y direction, and is located at the border between the curved portion 60a2 and the flat portion 60a1. The fourth position P4 is the position on the first inclined portion SL1 farthest from the bottom surface 60b. Specifically, the fourth position P4 refers to the end of the first inclined portion SL1 in the Y direction, and is located at the border between the first inclined portion SL1 and the second inclined portion SL2, i.e., the center of the curved portion 60a2. The first position P1 and the second position P2 fall within the range from the third position P3 to the fourth position P4.

Both the angle that the first inclined portion SL1 forms with the bottom surface 60b at the third position P3 and the angle that the first inclined portion SL1 forms with the bottom surface 60b at the fourth position P4 are 0°. Both the first and second angles θ1 and θ2 are greater than 0° and less than 90°. In the present example embodiment, in particular, the first inclined portion SL1 is inclined relative to the bottom surface 60b so that the first angle θ1 is maximum and the second angle θ2 is minimum within the range from the first position P1 to the second position P2.

The outline of the first inclined portion SL1 in a given cross section S includes a plurality of curves where each curve has a different curvature. The absolute value of a curvature k1 of the first inclined portion SL1 at the first position P1 is less than that of a curvature k2 of the first inclined portion SL1 at the second position P2. In other words, the first inclined portion SL1 at the first position P1 is straighter than the first inclined portion SL1 at the second position P2, and curves gently.

In FIG. 7, the circular arc denoted by the symbol C1 represents a part of a circle approximating the first inclined portion SL1 at the first position P1, i.e., a first circle of curvature. The circular arc denoted by the symbol C2 represents a part of a circle approximating the first inclined portion SL1 at the second position P2, i.e., a second circle of curvature. As shown in FIG. 7, the first circle of curvature (symbol C1) has a radius greater than that of the second circle of curvature (symbol C2).

In the range from the first position P1 to the second position P2, the absolute value of the curvature of the first inclined portion SL1 is maximized at a predetermined position other than the first position P1 on the first inclined portion SL1. The predetermined position may be the second position P2 or a position other than the first and second positions P1 and P2. The absolute value of the curvature of the first inclined portion SL1 may increase monotonically from the first position P1 to the second position P2, or may increase on a whole while increasing and decreasing repeatedly.

In the example shown in FIG. 7, the outline of the first inclined portion SL1 in a given cross section S is a smooth curve from the first position P1 to the second position P2. However, the outline of the first inclined portion SL1 may include a point where the curvature is substantially infinite. In such a case, the outline of the first inclined portion SL1 bends at the point where the curvature is substantially infinite. An angle θb that the first inclined portion SL1 forms with the bottom surface 60b at the bending point is defined as follows. An angle that the first inclined portion SL1 forms with the bottom surface 60b at a point on the first inclined portion SL1 near the bending point and closer to the bottom surface 60b than is the bending point will be denoted by θa. An angle that the first inclined portion SL1 forms with the bottom surface 60b at a point on the first inclined portion SL1 near the bending point and farther from the bottom surface 60b than is the bending point will be denoted by θc. The angle θb is an angle smaller than the angle θa and greater than the angle θc. The angle θb may be an average of the angles θa and θc.

The MR element 30 is provided on the first inclined portion SL1 so that the first edge 30c is located above the first position P1 in a given cross section S. Further, in the present example embodiment, the MR element 30 is provided on the first inclined portion SL1 so that the second edge 30d is located above the second position P2 in the given cross section S. Thus, in the present example embodiment, the MR element 30 is provided on the area ranging from the first position P1 to the second position P2 on the first inclined portion SL1.

As shown in FIGS. 6 and 7, the free layer 34 of the MR element 30 includes a first surface 34a, a second surface 34b opposite to the first surface 34a, and an outer peripheral surface connecting the first surface 34a and the second surface 34b. The first surface 34a is located farther from the opposed surface 60a of the support member 60 than is the second surface 34b. The first surface 34a is in contact with the cap layer 35. The second surface 34b is in contact with the spacer layer 33.

In the present example embodiment, the MR element 30 is patterned to a shape that is long in the X direction. The first and second surfaces 34a and 34b thus each have a shape that is long in the X direction. The first surface 34a has a first edge Ed1 and a second edge Ed2 located at both lateral ends of the first surface 34a. The first edge Ed1 is located at the first edge 30c of the MR element 30. The second edge Ed2 is located at the second edge 30d of the MR element 30.

As employed herein, an angle that the first surface 34a forms with the bottom surface 60b of the support member 60 will be referred to as an inclination angle and denoted by the symbol φ. The first surface 34a is inclined relative to the bottom surface 60b of the support member 60 so that the inclination angle φ is greater than 0°.

As employed herein, the inclination angle φ at the first edge Ed1 will be referred to as an inclination angle φ1. The inclination angle φ at the second edge Ed2 will be referred to as an inclination angle φ2. In a given cross section S, the inclination angle φ1 at the first edge Ed1 is greater than the inclination angle φ2 at the second edge Ed2. In a given cross section S, the inclination angle φ may increase toward the first edge Ed1 from the second edge Ed2.

The inclination angle φ at a given position on the first surface 34a changes depending on the angle θ that the first inclination portion SL1 forms with the bottom surface 60b. Specifically, the inclination angle φ at a given position on the first surface 34a is substantially the same as the angle θ at a position on the first inclined portion SL1 below the given position. The inclination angle φ thus increases as the angle θ increases.

The free layer 34 has a thickness T that is a dimension in a direction perpendicular to the first surface 34a. The thickness T can also be said to be the distance between the first and second surfaces 34a and 34b in the direction perpendicular to the first surface 34a. As employed herein, the thickness T at the first edge Ed1 will be referred to as a thickness T1. The thickness T at the second edge Ed2 will be referred to as a thickness T2. The thickness T1 is also the thickness T at the first edge 30c of the MR element 30. The thickness T2 is also the thickness T at the second edge 30d of the MR element 30. For the sake of convenience, an imaginary surface is assumed by extending the second surface 34b along the curved portion 60a2, and the thickness T2 is defined as the distance between the first surface 34a and the imaginary surface in the direction perpendicular to the first surface 34a.

In a given cross section S, the thickness T1 at the first edge Ed1 is smaller than the thickness T2 at the second edge Ed2. In a given cross section S, the thickness T may decrease toward the first edge Ed1 from the second edge Ed2.

The thickness T at a given position on the first surface 34a changes depending on the angle θ. Specifically, the thickness T at a given position on the first surface 34a decreases as the angle θ at the position on the first inclined portion SL1 closest to the given position increases.

From the relationship between the inclination angle φ and the angle θ and the relationship between the thickness T and the angle θ, the thickness T decreases as the inclination angle φ increases.

The foregoing description has been given by using the first inclined portion SL1 as an example. The first inclined portion SL1 and the second inclined portion SL2 have a shape symmetrical or substantially symmetrical about the XZ plane including the center of the curved portion 60a2. The foregoing description of the first inclined portion SL1 therefore also applies to the second inclined portion SL2. The foregoing description of the MR element 30 also applies to the MR element 30 provided on the second inclined portion SL2.

Now, a manufacturing method for the magnetic sensor 1 according to the present example embodiment will be described with reference to FIG. 8 to FIG. 12. The manufacturing method for the magnetic sensor 1 includes steps of forming the portions of the magnetic sensor 1 shown in FIGS. 3 to 5, i.e., the detection unit, and steps of completing the magnetic sensor 1 by using the detection unit. FIGS. 8 to 12 show the steps of forming the detection unit. Note that FIGS. 8 to 12 deal with the MR element 30 formed on the first inclined portion SL1.

Figure 8:
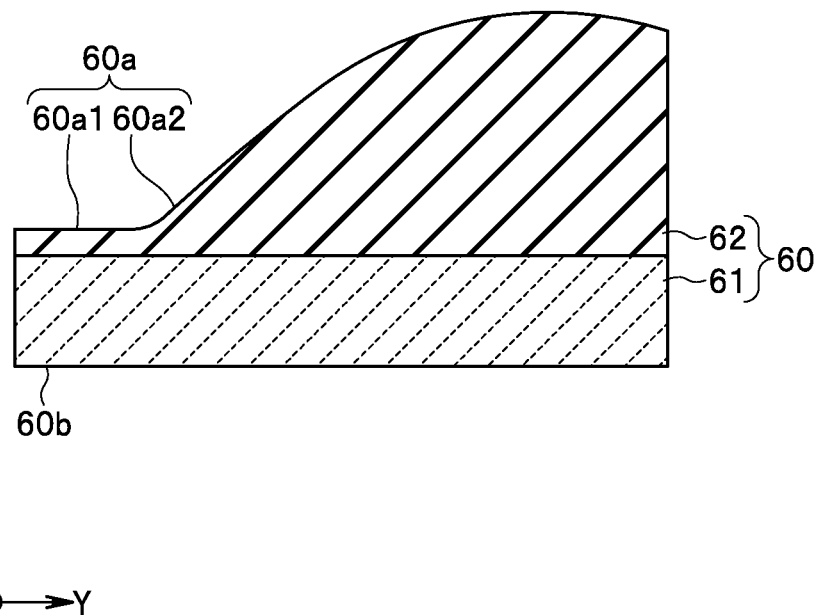
FIG. 8 is a cross-sectional view showing a step of a manufacturing method for the magnetic sensor according to the first example embodiment of the technology.

As shown in FIG. 8, in the steps of forming the detection unit, the insulating layer 62 is initially formed on the substrate 61. The insulating layer 62 may be formed by forming a photoresist mask on the substrate 61 and then forming an insulating film. The insulating layer 62 may be formed by forming an insulating film on the substrate 61 and then etching a part of the insulating film. The formation of the insulating layer 62 completes the support member 60.

Figure 9:
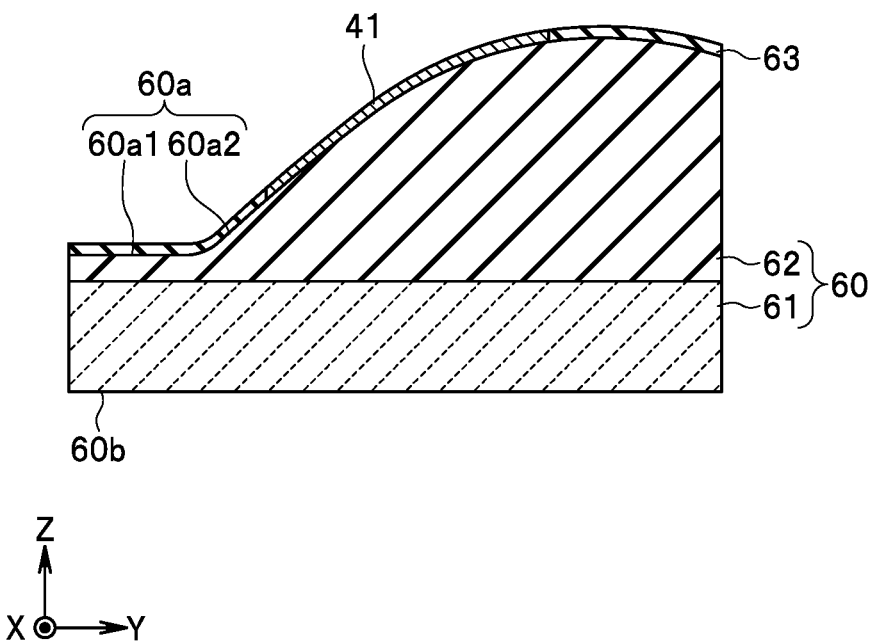
FIG. 9 is a cross-sectional view showing a step that follows the step in FIG. 8.

FIG. 9 shows the next step. In this step, the lower electrode 41 and the insulating layer 63 are formed on the insulating layer 62, i.e., on the support member 60. For example, the lower electrode 41 and the insulating layer 63 are formed in the following manner. A metal film is initially formed on the insulating layer 62. An etching mask is then formed on the metal film. The etching mask may be formed by photolithographically patterning a photoresist layer. Next, the metal film is etched using the etching mask to be made into the lower electrode 41. The insulating layer 63 is then formed with the etching mask left unremoved. The etching mask is then removed.

Figure 10:
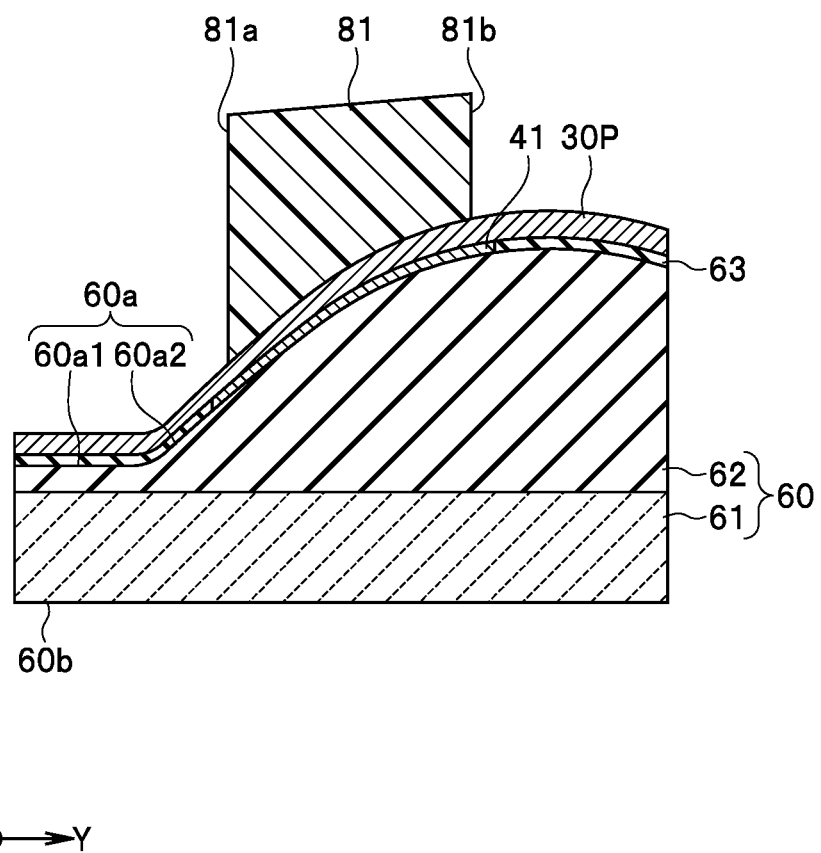
FIG. 10 is a cross-sectional view showing a step that follows the step in FIG. 9.

FIG. 10 shows the next step. In this step, films that later become the layers constituting the MR element 30 are formed in order, and a layered film 30P which later becomes the MR element 30 is formed on the lower electrode 41 and the insulating layer 63. An etching mask 81 is then formed on the layered film 30P. The etching mask 81 is formed by photolithographically patterning a photoresist layer. The etching mask 81 has a planar shape (shape seen from above) corresponding to that of the MR element 30. The etching mask 81 has a first wall surface 81a for defining the position of the first edge 30c of the MR element 30, and a second wall surface 81b for defining the position of the second edge 30d of the MR element 30.

Figure 11:
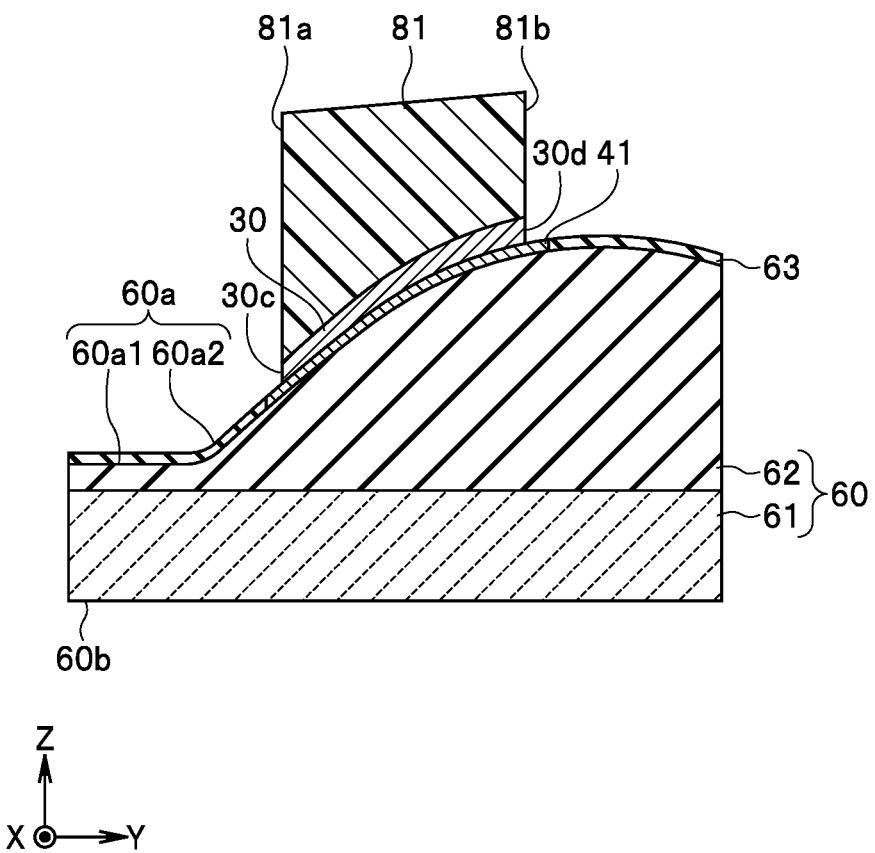
FIG. 11 is a cross-sectional view showing a step that follows the step in FIG. 10.

FIG. 11 shows the next step. In this step, the layered film 30P is etched by, for example, ion milling or reactive ion etching using the etching mask 81. The layered film 30P is thereby made into the MR element 30.

Figure 12:
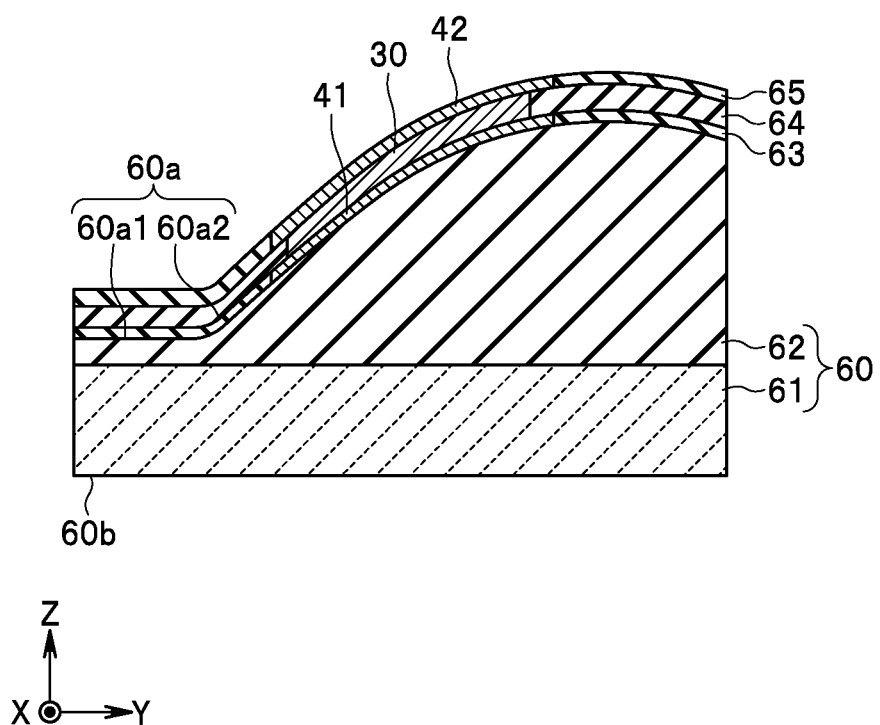
FIG. 12 is a cross-sectional view showing a step that follows the step in FIG. 11.

FIG. 12 shows the next step. In this step, the insulating layer 64 is initially formed with the etching mask 81 left unremoved. The etching mask 81 is then removed. The upper electrode 42 and the insulating layer 65 are then formed on the MR element 30 and the insulating layer 64. The method for forming the upper electrode 42 and the insulating layer 65 is the same as that for forming the lower electrode 41 and the insulating layer 63.

A not-shown insulating layer is then formed to cover the upper electrode 42 and the insulating layer 65. Next, a plurality of terminals constituting the power supply nodes V1 and V2 and the like are formed to complete the detection unit of the magnetic sensor 1.

Figure 13:
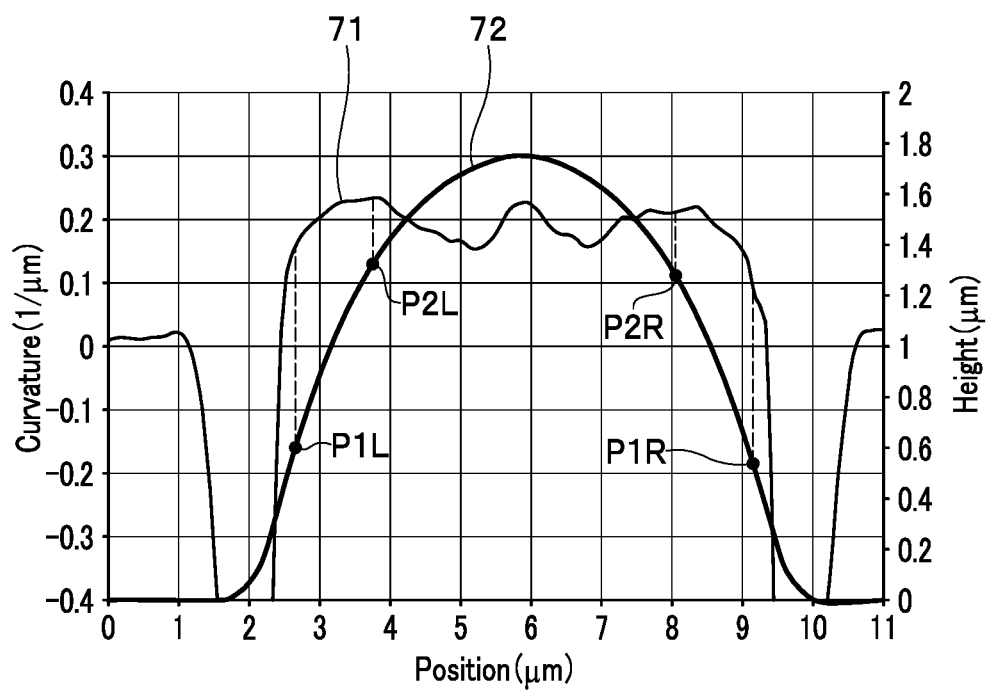
FIG. 13 is a characteristic chart showing the shape and curvature of the opposed surface of the support member according to the first example embodiment of the technology.

Next, an example of the shape and curvature of the opposed surface 60a of the support member 60 will be described with reference to FIG. 13. FIG. 13 is a characteristic chart showing the shape and curvature of the opposed surface 60a of the support member 60 in a predetermined cross section S. FIG. 13 is obtained by measuring the opposed surface 60a of an actually manufactured support member 60 under an atomic force microscope. In FIG. 13, the horizontal axis indicates the position in a direction parallel to the Y direction. The vertical axis on the left indicates the curvature of the opposed surface 60a. The curvature shown in FIG. 13 is defined so that the curvature has a positive value if the opposed surface 60a is a convex surface protruding in a direction away from the bottom surface 60b. The vertical axis on the right indicates the height of the opposed surface 60a. In FIG. 13, the height of the opposed surface 60a refers to the position in a direction parallel to the Z direction. In FIG. 13, the height of the flat portion 60a1 of the opposed surface 60a is assumed to be 0. The solid line denoted by the reference numeral 71 represents the curvature of the opposed surface 60a. The thick solid line denoted by the reference numeral 72 represents the height of the opposed surface 60a.

In FIG. 13, the points denoted by the symbols P1L and P2L represent the positions corresponding to the first and second edges 30c and 30d of the MR element 30 provided on the first inclined portion SL1, respectively. The MR element 30 is provided on the area ranging from the point P1L to the point P2L on the first inclined portion SL1. The points P1L and P2L substantially represent the first and second positions P1 and P2 on the first inclined portion SL1. As shown in FIG. 13, the angle that the opposed surface 60a forms with the bottom surface 60b at the point P1L is greater than the angle that the opposed surface 60a forms with the bottom surface 60b at the point P2L. The absolute value of the curvature of the opposed surface 60a at the point P1L is less than that of the curvature of the opposed surface 60a at the point P2L. In the range from the point P1L to the point P2L, the absolute value of the curvature of the opposed surface 60a is minimized at the point P1L and maximized at a predetermined position other than the point P1L.

Similarly, in FIG. 13, the points denoted by the symbols P1R and P2R represent the positions corresponding to the first and second edges 30c and 30d of an MR element 30 provided on the second inclined portion SL2, respectively. The MR element 30 is provided on the area ranging from the point P1R to the point P2R on the second inclined portion SL2. The points P1R and P2R substantially represent the first and second positions P1 and P2 on the second inclined portion SL2. As shown in FIG. 13, the angle that the opposed surface 60a forms with the bottom surface 60b at the point P1R is greater than the angle that the opposed surface 60a forms with the bottom surface 60b at the point P2R. The absolute value of the curvature of the opposed surface 60a at the point P1R is less than that of the curvature of the opposed surface 60a at the point P2R. In the range from the point P1R to the point P2R, the absolute value of the curvature of the opposed surface 60a is minimized at the point P1R and maximized at a predetermined position other than the point P1R.

The operation and effect of the magnetic sensor 1 according to the present example embodiment will now be described. As shown in FIG. 7, in the present example embodiment, the first inclined portion SL1 is inclined relative to the bottom surface 60b at the first angle θ1 at the first position P1 and inclined relative to the bottom surface 60b at the second angle θ2 smaller than the first angle θ1 at the second position P2 in a given cross section S. The absolute value of the curvature k1 of the first inclined portion SL1 at the first position P1 is less than that of the curvature k2 of the first inclined portion SL1 at the second position P2.

The MR element 30 provided on the first inclined portion SL1 is disposed on the first inclined portion SL1 so that the first edge 30c is located above the first position P1 in a given cross section S. Further, in the present example embodiment, the MR element 30 is disposed on the first inclined portion SL1 so that the second edge 30d is located above the second position P2 in the given cross section S.

As described with reference to FIGS. 8 to 12, the MR element 30 is formed by etching the layered film 30P. The etching uses the etching mask 81. The etching mask 81 is formed at a desired position on the layered film 30P by photolithographically patterning a photoresist layer.

The etching mask 81 has the first wall surface 81a for defining the position of the first edge 30c of the MR element 30 and the second wall surface 81b for defining the position of the second edge 30d of the MR element 30. The first wall surface 81a is designed to be located above the first position P1 defined in advance. The second wall surface 81b is designed to be located above the second position P2 defined in advance. However, in the actual manufacturing process, the position and dimensions of the etching mask 81 can vary due to the precision of the photolithography. This changes the positions of the first and second wall surfaces 81a and 81b, and the positions of the first and second edges 30c and 30d of the MR element 30 deviate from the respective designed positions.

The amount of deviation in the angle that the first inclined portion SL1 forms with the bottom surface 60b at a predetermined position P on the first inclined portion SL1 will now be described. Here, the angle that the first inclined portion SL1 forms with the bottom surface 60b at the predetermined position P will be denoted by the symbol θ. The curvature of the first inclined portion SL1 at the predetermined position P will be denoted by the symbol k. The amount of deviation in the angle that the first inclined portion SL1 forms with the bottom surface 60b when the predetermined position P is shifted by Δy in the direction parallel to the Y direction will be denoted by the symbol Δθ. If Δy is sufficiently small, the amount of deviation Δθ can be expressed by the following Eq. (1):

$$\Delta\theta = k * \Delta y / \cos\theta \quad (1)$$

Here, the curvature k is assumed to be constant.

As can be seen from Eq. (1), the greater the curvature k, the greater the amount of deviation Δθ. The greater the angle θ, the greater the amount of deviation Δθ as well.

As described above, the thickness T of the free layer 34 of the MR element 30 changes depending on the angle θ. Thus, from Eq. (1), it can be said that the greater the curvature k, the greater the amount of change in the thickness T, and the greater the angle θ, the greater the amount of change in the thickness T.

In the present example embodiment, the first angle θ1 is greater than the second angle θ2. Suppose, for example, that the outline of the first inclined portion SL1 has a constant curvature k like a circular arc, and given the same Δy, the amount of deviation Δθ near the first position P1 is greater than the amount of deviation Δθ near the second position P2. As a result, the amount of change in the thickness T at the first edge 30c is greater than the amount of change in the thickness T at the second edge 30d.

By contrast, in the present example embodiment, the absolute value of the curvature k1 of the first inclined portion SL1 at the first position P1 is less than that of the curvature k2 of the first inclined portion SL1 at the second position P2. In other words, in the present example embodiment, the first inclined portion SL1 is configured to have a relatively small curvature k at the position where the amount of change in the thickness T of the free layer 34 is relatively large. As a result, according to the present example embodiment, a change in the thickness T of the free layer 34 near the first edge 30c due to variations in the manufacturing process can thus be reduced compared to the case where the curvature k of the first inclined portion SL1 is constant or the absolute value of the curvature k1 is greater than that of the curvature k2.

According to the present example embodiment, a change in the thicknesses of the layers constituting the MR element 30, other than the free layer 34 near the first edge 30c, due to variations in the manufacturing process can also be reduced. As a result, according to the present example embodiment, a change in the thickness of the MR element 30 (a dimension in the direction perpendicular to the first inclined portion SL1) near the first edge 30c due to variations in the manufacturing process can be reduced.

In the present example embodiment, the MR element 30 is provided so that the second edge 30d is located above the second position P2 where the amount of change in the thickness T of the free layer 34 is relatively small. Therefore, according to the present example embodiment, a change in the thickness T of the free layer 34 near the second edge 30d and the thickness of the MR element 30 near the second edge 30d due to variations in the manufacturing process can thus be reduced. As a result, according to the present example embodiment, a change in the thickness T of the entire free layer 34 and the thickness of the entire MR element 30 can be reduced.

Next, other effects of the present example embodiment will be described. In the present example embodiment, the thickness T of the free layer 34 at a given position on the first surface 34a decreases as the angle θ at the position on the first inclined portion SL1 closest to the given position increases. Such a relationship between the thickness T and the angle θ can be achieved by forming the layered film 30P using a so-called non-conformal film formation apparatus such as a magnetron sputtering apparatus.

In the present example embodiment, in particular, the thickness T1 at the first edge Ed1 is smaller than the thickness T2 at the second edge Ed2 in a given cross section S. Therefore, according to the present example embodiment, the concentration of magnetic charges at and near the first edge Ed1 of the free layer 34 can thus be reduced.

Figure 14:
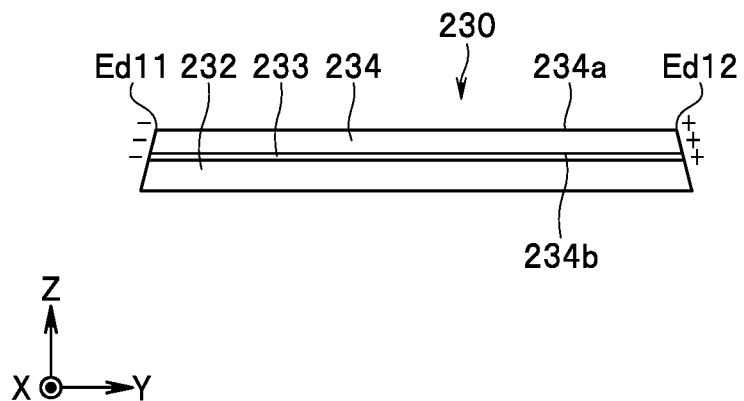
FIG. 14 is an explanatory diagram for describing magnetic charges on a magnetoresistive element of a comparative example.

The effect of reducing the concentration of magnetic charges will be described in detail below by comparison with an MR element 230 according to a comparative example. The MR element 230 of the comparative example will initially be described with reference to FIG. 14. FIG. 14 is an explanatory diagram for describing magnetic charges on the MR element 230 of the comparative example. FIG. 14 shows a cross section corresponding to the cross section S. Like the MR element 30 according to the present example embodiment, the MR element 230 according to the comparative example includes a magnetization pinned layer 232, a spacer layer 233, a free layer 234, and a not-shown underlayer and cap layer.

The MR element 230 of the comparative example is located on a flat surface parallel to the bottom surface 60b of the support member 60. Like the MR element 30 according to the present example embodiment, the MR element 230 is patterned to a shape that is long in the X direction. This gives the free layer 234 magnetic shape anisotropy where the direction of the easy axis of magnetization is parallel to the X direction.

The free layer 234 includes a first surface 234a located at an end in the Z direction, a second surface 234b opposite to the first surface 234a, and an outer peripheral surface connecting the first surface 234a and the second surface 234b. Both the first and second surfaces 234a and 234b are flat surfaces parallel to the bottom surface 60b. The first and second surfaces 234a and 234b each have a shape that is long in the X direction. The first surface 234a has a first edge Ed11 and a second edge Ed12 located at both ends in the lateral direction of the first surface 234a, i.e., a direction parallel to the Y direction. In particular, in the comparative example, the first edge Ed11 is an edge located at the end of the first surface 234a in the −Y direction. The second edge Ed12 is an edge located at the end of the first surface 234a in the Y direction.

If an external magnetic field is applied to the MR element 230, the direction of the magnetic moment inside the free layer 234 rotates depending on the direction and strength of the external magnetic field. As a result, the direction of the magnetization of the free layer 234 rotates. Here, magnetic charges occur on the outer peripheral surface of the free layer 234.

Now, suppose that an external magnetic field in the Y direction is applied to the MR element 230. If the external magnetic field in the Y direction is applied, positive magnetic charges concentrate at a portion of the outer peripheral surface of the free layer 234 near the second edge Ed12, and negative magnetic charges concentrate at a portion of the outer peripheral surface of the free layer 234 near the first edge Ed11. In FIG. 14, the symbols "+" represent positive magnetic charges, and the symbols "−" negative magnetic charges. A demagnetizing field in the −Y direction occurs in the free layer 234 due to such magnetic charges. The strength of the demagnetizing field is higher as it is closer to the magnetic charges. The strength of the demagnetizing field in the portions of the free layer 234 near the first and second edges Ed11 and Ed12 is therefore high. The strength of the demagnetizing field in the midsection of the free layer 234 is low.

If no external magnetic field is applied, the direction of the magnetization of the free layer 234 and the direction of the magnetic moment in the free layer 234 are parallel to the X direction. If the strength of the external magnetic field is low, the direction of the magnetic moment in the midsection of the free layer 234 starts to rotate toward the Y direction. On the other hand, the direction of the magnetic moment in the portions of the free layer 234 near the first and second edges Ed11 and Ed12 does not rotate or hardly rotates.

If the strength of the external magnetic field becomes high to a certain extent, the direction of the magnetic moment in the midsection of the free layer 234 becomes the same or substantially the same as the Y direction. Meanwhile, the direction of the magnetic moment in the portions of the free layer 234 near the first and second edges Ed11 and Ed12 starts to rotate toward the Y direction. If the strength of the external magnetic field becomes even higher, the direction of the magnetic moment in the portions of the free layer 234 near the first and second edges Ed11 and Ed12 also becomes the same or substantially the same as the Y direction.

As described above, in the MR element 230 of the comparative example, the direction of the magnetic moment in the entire free layer 234 does not change uniformly because of the demagnetizing field. As a result, the magnetization of the free layer 234 changes nonlinearly with respect to a change in the strength of the external magnetic field. Consequently, a detection signal generated by a magnetic sensor including the MR element 230 of the comparative example changes nonlinearly with respect to a change in the strength of the external magnetic field.

Figure 15:
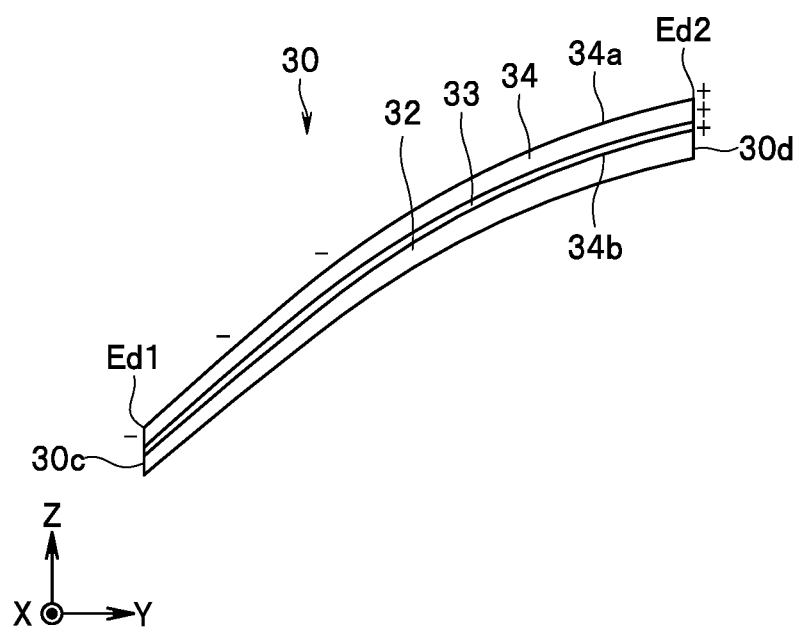
FIG. 15 is an explanatory diagram for describing magnetic charges on the magnetoresistive element of the first example embodiment of the technology.

Next, magnetic charges on the MR element 30 according to the present example embodiment will be described. FIG. 15 is an explanatory diagram for describing magnetic charges on the MR element 30. FIG. 15 shows a cross section corresponding to the cross section S. In FIG. 15, the symbols "+" represent positive magnetic charges, and the symbols "−" negative magnetic charges.

In the MR element 30 according to the present example embodiment, the thickness T1 at the first edge Ed1 is smaller than the thickness T2 at the second edge Ed2. Now, suppose that an external magnetic field in the Y direction is applied to the MR element 30. In such a case, positive magnetic charges concentrate at a portion of the outer peripheral surface of the free layer 34 near the second edge Ed2 as in the comparative example. By contrast, negative magnetic charges do not concentrate at a portion of the outer peripheral surface of the free layer 34 near the first edge Ed1 but are distributed even over the first surface 34a. This reduces a difference between the strength of the demagnetizing field at the portion of the free layer 34 near the first edge Ed1 and that of the demagnetizing field in the midsection of the free layer 34. As the difference decreases, the direction of the magnetic moment at the portion of the free layer 34 near the first edge Ed1 rotates more similarly to that of the magnetic moment in the midsection of the free layer 34. According to the present example embodiment, the magnetization of the free layer 34 can thus be prevented from changing nonlinearly with respect to a change in the strength of the external magnetic field. As a result, according to the present example embodiment, the range where the detection signal generated by the magnetic sensor 1 change linearly can be expanded.

To reduce variations in the thickness of the MR element 30 due to variations in the manufacturing process, the curvature k of the entire first inclined portion SL1 can be reduced. This, however, reduces a difference between the first angle θ1 and the second angle θ2, and reduces a difference between the thickness T1 at the first edge Ed1 and the thickness T2 at the second edge Ed2. In particular, if the entire first inclined portion SL1 has a curvature k of 0, i.e., the entire first inclined portion SL1 is a flat surface, the first angle θ1 and the second angle θ2 are the same, and the thickness T1 at the first edge Ed1 and the thickness T2 at the second edge Ed2 are the same. This annihilates the effect of reducing the concentration of magnetic charges at and near the first edge Ed1.

By contrast, according to the present example embodiment, the absolute value of the curvature k2 of the first inclined portion SL1 at the second position P2 where the angle θ is relatively small is made relatively large. According to the present example embodiment, the difference between the first angle θ1 and the second angle θ2 is thereby increased to increase the difference between the thickness T1 at the first edge Ed1 and the thickness T2 at the second edge Ed2. According to the present example embodiment, the concentration of magnetic charges at and near the first edge Ed1 of the free layer 34 can thus be reduced while reducing a change in the thickness T1 at the first edge Ed1 due to variations in the manufacturing process.

The effects of the present example embodiment have so far been described by using the MR element 30 provided on the first inclined portion SL1 as an example. However, the foregoing description also applies to the MR element 30 provided on the second inclined portion SL2 since the first inclined portion SL1 and the second inclined portion SL2 have a symmetrical shape.

Modification Example

Figure 16:
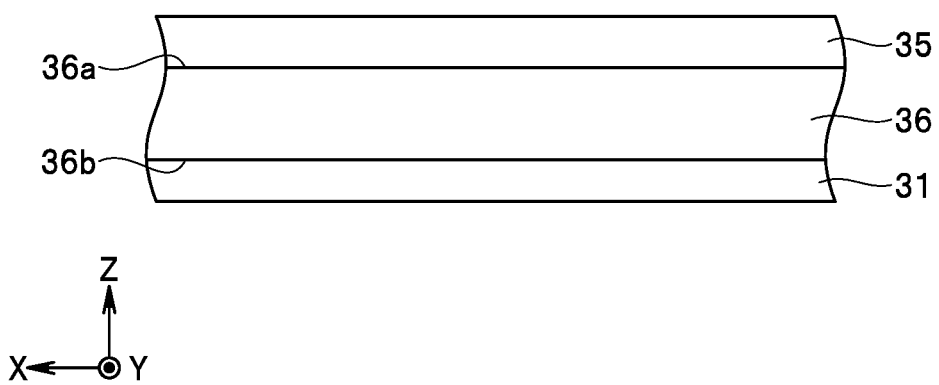
FIG. 16 is a cross-sectional view showing a modification example of the magnetoresistive element of the first example embodiment of the technology.

Next, a modification example of the MR element 30 will be described with reference to FIG. 16. In the modification example, the MR element 30 is an anisotropic magnetoresistive (AMR) element. In the modification example, the MR element 30 includes a magnetic layer 36 given magnetic anisotropy, instead of the magnetization pinned layer 32, the spacer layer 33, and the free layer 34 shown in FIG. 6. The magnetic layer 36 has a magnetization whose direction is variable depending on the direction of the external magnetic field. As described above, the MR element 30 is patterned to a shape that is long in the X direction. This gives the magnetic layer 36 magnetic shape anisotropy where the direction of the easy axis of magnetization is parallel to the X direction.

The magnetic layer 36 has a first surface 36a having a shape that is long in the X direction, a second surface 36b opposite to the first surface 36a, and an outer peripheral surface connecting the first surface 36a and the second surface 36b. The description of the shape of the MR element 30 with reference to FIGS. 6 and 7 also applies to the modification example. The description of the shape of the MR element 30 applies to the shape of that in the modification example, with the free layer 34, the first surface 34a, and the second surface 34b in the description replaced with the magnetic layer 36, the first surface 36a, and the second surface 36b, respectively.

Second Example Embodiment

Figure 17:
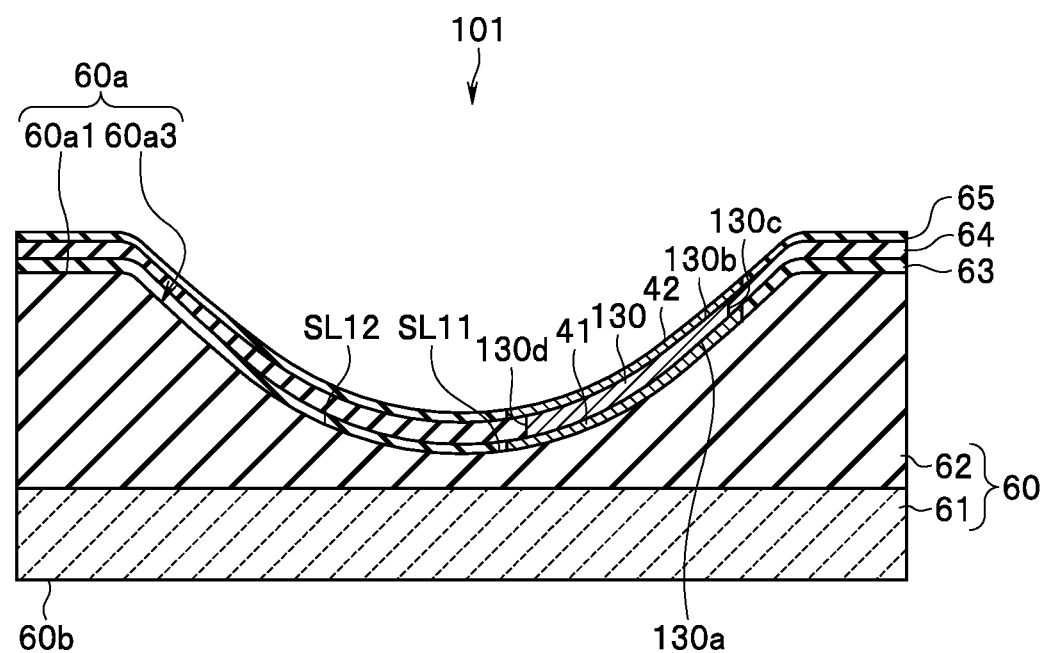
FIG. 17 is a cross-sectional view showing a cross section of a magnetic sensor according to a second example embodiment of the technology.

A second example embodiment of the technology will now be described. Initially, a configuration of a magnetic sensor according to the present example embodiment will be described with reference to FIG. 17. FIG. 17 is a cross-sectional view showing a part of the magnetic sensor according to the present example embodiment.

A configuration of the magnetic sensor 101 according to the present example embodiment differs from that of the magnetic sensor 1 according to the first example embodiment in the following respect. The magnetic sensor 101 according to the present example embodiment includes MR elements 130 instead of the MR elements 30 according to the first example embodiment. FIG. 17 shows a cross section parallel to the YZ plane and intersecting an MR element 130.

The opposed surface 60a of the support member 60 includes at least one curved portion 60a3 not parallel to the bottom surface 60b, instead of the curved portion 60a2 according to the first example embodiment. As shown in FIG. 17, the curved portion 60a3 is a concave surface recessed toward the bottom surface 60b. As will be described below, the opposed surface 60a includes inclined portions that are a part of the concave surface (curved portion 60a3). The curved portion 60a3 has a curved shape (arch shape) curved to be recessed toward the bottom surface 60b (–Z direction) in a given cross section parallel to the YZ plane. In the given cross section parallel to the YZ plane, the distance from the bottom surface 60b to the curved portion 60a3 is the smallest at the center of the curved portion 60a3 in a direction parallel to the Y direction (hereinafter, referred to simply as the center of the curved portion 60a3).

The curved portion 60a3 extends along the X direction. The overall shape of the curved portion 60a3 is a semicylindrical curved surface formed by moving the curved shape shown in FIG. 17 along the X direction. The insulating layer 62 of the support member 60 has a cross-sectional shape such that the curved portion 60a3 is formed in the opposed surface 60a. Specifically, the insulating layer 62 has a cross-sectional shape recessed in the –Z direction in a given cross section parallel to the YZ plane.

A portion of the curved portion 60a3 from an edge at the end of the curved portion 60a3 in the Y direction to the center of the curved portion 60a3 will be referred to as a first inclined portion and be denoted by the symbol SL11. A portion of the curved portion 60a3 from an edge at the end of the curved portion 60a3 in the –Y direction to the center of the curved portion 60a3 will be referred to as a second inclined portion and be denoted by the symbol SL12. Both the first and second inclined portions SL11 and SL12 are inclined relative to the bottom surface 60b. In the present example embodiment, the entire MR element 130 is located on the first inclined portion SL11 or the second inclined portion SL12. FIG. 17 shows how the MR element 130 is located on the first inclined portion SL11.

The MR element 130 has a shape that is long in the X direction. The MR element 130 has a rectangular planar shape. As employed herein, the lateral direction of the MR element 130 will be referred to as the width direction of the MR element 130 or simply as the width direction. The MR element 130 has a bottom surface 130a, a top surface 130b, a first edge 130c, a second edge 130d, a third edge, and a fourth edge. The bottom surface 130a is opposed to the curved portion 60a3. The top surface 130b is located opposite the bottom surface 130a. The first and second edges 130c and 130d are located at both ends in the width direction. The third and fourth edges are located at both ends in the longitudinal direction. The dimension of the MR element 130 in the width direction is constant or substantially constant regardless of the position in the X direction.

The MR element 130 may be a spin-valve MR element or an AMR element. The following description will be given by using the case where the MR element 130 is a spin-valve MR element as an example. Like the MR element 30 shown in FIG. 6 of the first example embodiment, the MR element 130 includes an underlayer 31, a magnetization pinned layer 32, a spacer layer 33, a free layer 34, and a cap layer 35. The free layer 34 has magnetic shape anisotropy where the direction of the easy axis of magnetization is parallel to the X direction.

Figure 18:
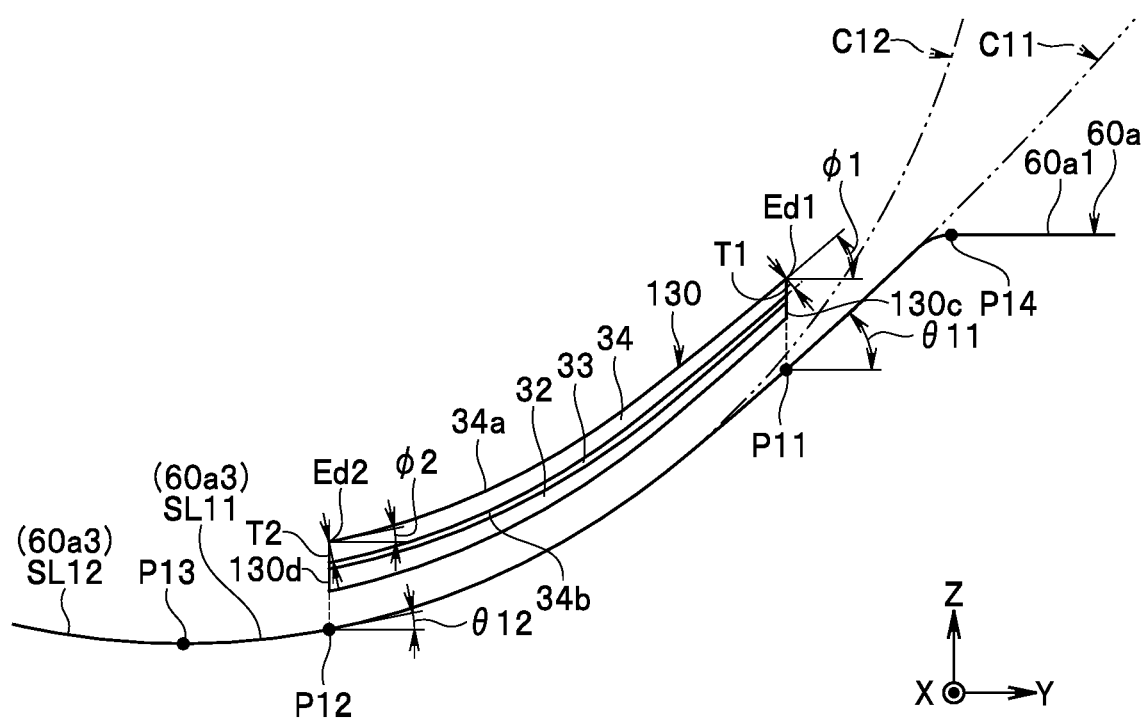
FIG. 18 is an explanatory diagram for describing a shape of an inclined portion of the second example embodiment of the technology.

Next, the inclined portions and the MR elements 130 will be described in detail with reference to FIG. 18. The following description will be given by using the first inclined portion SL11 as an example. FIG. 18 is an explanatory diagram for describing the shape of the first inclined portion SL11. FIG. 18 is an enlarged view of a part of the cross section shown in FIG. 17. In FIG. 18, the underlayer 31 and the cap layer 35 of the MR element 130 are omitted.

A cross section intersecting the MR element 130 and being perpendicular to the bottom surface 60b of the support member 60 will be denoted by the symbol S. To describe the shape of the first inclined portion SL11, a first position P11, a second position P12, a third position P13, and a fourth position P14 on the first inclined portion SL11 in a given cross section S will be defined as follows. The first position P11 is a position where the first inclined portion SL11 is inclined relative to the bottom surface 60b at a first angle θ11. The second position P12 is a position where the first inclined portion SL11 is inclined relative to the bottom surface 60b at a second angle θ12 smaller than the first angle θ11. In the present example embodiment, in particular, the first position P11 is farther from the bottom surface 60b than is the second position P12.

The third position P13 is the position on the first inclined portion SL11 closest to the bottom surface 60b. Specifically, the third position P13 is located at the border between the first inclined portion SL11 and the second inclined portion SL12, i.e., the center of the curved portion 60a3. The fourth position P14 is the position on the first inclined portion SL11 farthest from the bottom surface 60b. Specifically, the fourth position P14 is located at the border between the curved portion 60a3 and the flat portion 60a1. The first position P11 and the second position P12 fall within the range from the third position P13 to the fourth position P14.

Both the angle that the first inclined portion SL11 forms with the bottom surface 60b at the third position P13 and the angle that the first inclined portion SL11 forms with the bottom surface 60b at the fourth position P14 are 0°. Both the first and second angles θ11 and θ12 are greater than 0° and less than 90°.

The outline of the first inclined portion SL11 in a given cross section S includes a plurality of curves where each curve has a different curvature. The absolute value of a curvature k11 of the first inclined portion SL11 at the first position P11 is less than that of a curvature k12 of the first inclined portion SL11 at the second position P12.

In FIG. 18, the circular arc denoted by the symbol C11 represents a part of a circle approximating the first inclined portion SL11 at the first position P11, i.e., a first circle of curvature. The circular arc denoted by the symbol C12 represents a part of a circle approximating the first inclined portion SL11 at the second position P12, i.e., a second circle of curvature. As shown in FIG. 18, the first circle of curvature (symbol C11) has a radius greater than that of the second circle of curvature (symbol C12).

The MR element 130 is provided on the first inclined portion SL11 so that the first edge 130c is located above the first position P11 in a given cross section S. Further, in the present example embodiment, the MR element 130 is provided on the first inclined portion SL11 so that the second edge 130d is located above the second position P12 in the given cross section S.

As described in the first example embodiment, the free layer 34 has a first surface 34a, a second surface 34b, and an outer peripheral surface. The first surface 34a has a first edge Ed1 and a second edge Ed2 located at both lateral ends of the first surface 34a. The first edge Ed1 is located at the first edge 130c of the MR element 130. The second edge Ed2 is located at the second edge 130d of the MR element 130.

The relationship between the inclination angle φ1 at the first edge Ed1 and the inclination angle φ2 at the second edge Ed2 in a given cross section S is the same as in the first example embodiment. The relationship between the thickness T1 at the first edge Ed1 and the thickness T2 at the second edge Ed2 in a given cross section S is also the same as in the first example embodiment. For the sake of convenience, an imaginary surface is assumed by extending the second surface 34b along the curved portion 60a3, and the thickness T1 is defined as the distance between the first surface 34a and the imaginary surface in the direction perpendicular to the first surface 34a.

The foregoing description has been given by using the first inclined portion SL11 as an example. The first inclined portion SL11 and the second inclined portion SL12 have a shape symmetrical or substantially symmetrical about the XZ plane including the center of the curved portion 60a3. The foregoing description of the first inclined portion SL11 therefore also applies to the second inclined portion SL12. The foregoing description of the MR element 130 also applies to the MR element 130 provided on the second inclined portion SL12.

The configuration, operation and effects of the present example embodiment are otherwise the same as those of the first example embodiment.

The technology is not limited to the foregoing example embodiments, and various modification examples may be made thereto. For example, the number and arrangement of MR elements and the number and arrangement of curved portions are not limited to those described in the example embodiments, and may be freely chosen as long as the requirements set forth in the claims are satisfied.

The first and second surfaces 34a and 34b of the free layer 34 according to the technology may each have a shape long in a direction intersecting a given cross section S, not necessarily in the direction parallel to the X direction.

The second edge of the MR element according to the technology may be located on the flat portion 60a1 or a part of the curved portion parallel to the bottom surface 60b.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising: a magnetoresistive element whose resistance changes with an external magnetic field; and a support member configured to support the magnetoresistive element, wherein:

the support member has an opposed surface opposed to the magnetoresistive element, and a bottom surface formed of a flat surface located opposite the opposed surface;

the opposed surface includes an inclined portion inclined relative to the bottom surface;

in a specific cross section of the magnetic sensor perpendicular to the bottom surface, the inclined portion is inclined relative to the bottom surface at a first angle at a first position on the inclined portion, and inclined relative to the bottom surface at a second angle at a second position on the inclined portion, the second angle being smaller than the first angle;

an absolute value of a curvature of the inclined portion at the first position is less than an absolute value of a curvature of the inclined portion at the second position; and the magnetoresistive element has a first edge and a second edge located at both ends of the magnetoresistive element in a width direction, and is provided on the inclined portion so that the first edge is located above the first position in the cross section.

2. The magnetic sensor according to claim 1, wherein the magnetoresistive element is provided on the inclined portion so that the second edge is located above the second position in the cross section.

3. The magnetic sensor according to claim 1, wherein the first position and the second position fall within a range from a third position on the inclined portion closest to the bottom surface in the cross section to a fourth position on the inclined portion farthest from the bottom surface in the cross section.

4. The magnetic sensor according to claim 3, wherein:

the inclined portion is inclined relative to the bottom surface so that the first angle is a maximum and the second angle is a minimum within a range from the first position to the second position; and the absolute value of the curvature of the inclined portion is minimized at the first position and maximized at a predetermined position other than the first position within the range from the first position to the second position.

5. The magnetic sensor according to claim 1, wherein:
the opposed surface includes a convex surface protruding in a direction away from the bottom surface; and
the inclined portion is a part of the convex surface.

6. The magnetic sensor according to claim 1, wherein:
the opposed surface includes a concave surface recessed toward the bottom surface; and
the inclined portion is a part of the concave surface.

7. The magnetic sensor according to claim 1, wherein:
the magnetoresistive element includes a magnetic layer having a magnetization whose direction is variable depending on the external magnetic field;
the magnetic layer has a first surface and a second surface located opposite the first surface, and has a thickness that is a dimension in a direction perpendicular to the first surface of the magnetic layer; and
the thickness at the first edge is smaller than the thickness at the second edge.

8. The magnetic sensor according to claim 7, wherein the thickness decreases toward the first edge from the second edge.

9. The magnetic sensor according to claim 7, wherein the first surface and the second surface each have a shape long in a direction intersecting the cross section.

* * * * *